United States Patent
Chan et al.

(10) Patent No.: US 10,128,371 B2
(45) Date of Patent: Nov. 13, 2018

(54) SELF-ALIGNED NANOSTRUCTURES FOR SEMICONDUCTOR DEVICES

(71) Applicant: IMEC VZW, Leuven (BE)

(72) Inventors: Boon Teik Chan, Leuven (BE);
Clement Merckling, Evere (BE);
Zheng Tao, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/292,778

(22) Filed: Oct. 13, 2016

(65) Prior Publication Data
US 2017/0179281 A1    Jun. 22, 2017

(30) Foreign Application Priority Data
Dec. 21, 2015 (EP) .................................... 15201489

(51) Int. Cl.
*H01L 21/02* (2006.01)
*H01L 29/78* (2006.01)
(Continued)

(52) U.S. Cl.
CPC .... *H01L 29/7827* (2013.01); *H01L 21/02538* (2013.01); *H01L 21/02603* (2013.01);
(Continued)

(58) Field of Classification Search
CPC ......... H01L 29/0676; H01L 21/823481; H01L 21/823885; H01L 29/66666; H01L 29/7827; H01L 29/78642
See application file for complete search history.

(56) References Cited

U.S. PATENT DOCUMENTS

| 5,308,778 A | 5/1994 | Fitch et al. |
| 6,197,641 B1 | 3/2001 | Hergenrother et al. |
| (Continued) | | |

FOREIGN PATENT DOCUMENTS

| EP | 2 947 045 A1 | 11/2015 |
| WO | 2014/209390 A1 | 12/2014 |

OTHER PUBLICATIONS

European Search Report, European Patent Application No. 15201489. 0, dated Jun. 28, 2016, 8 pages.
(Continued)

*Primary Examiner* — Lynne Gurley
*Assistant Examiner* — Peter M Albrecht
(74) *Attorney, Agent, or Firm* — McDonnell Boehnen Hulbert & Berghoff LLP

(57) ABSTRACT

A method for forming a semiconductor device is disclosed. The method includes providing a semiconductor substrate. The method also includes epitaxially growing on the semiconductor substrate a first part of a III-V semiconductor nanostructure. The method further includes covering the first part of the III-V semiconductor nanostructure with a layer of a first material. Additionally, the method includes removing a top portion of the layer of the first material. Still further, the method includes epitaxially growing on the first part of the III-V semiconductor nanostructure a second part of the III-V semiconductor nanostructure. The method additionally includes covering the second part of the III-V semiconductor nanostructure with a layer of a second material. The second material is different from the first material. Even further, the method includes removing a top portion of the layer of the second material.

14 Claims, 13 Drawing Sheets

(51) Int. Cl.
*H01L 29/06* (2006.01)
*H01L 29/08* (2006.01)
*H01L 29/10* (2006.01)
*H01L 29/20* (2006.01)
*H01L 29/66* (2006.01)
*H01L 29/786* (2006.01)

(52) U.S. Cl.
CPC ...... *H01L 29/0676* (2013.01); *H01L 29/0847* (2013.01); *H01L 29/1037* (2013.01); *H01L 29/20* (2013.01); *H01L 29/66522* (2013.01); *H01L 29/66545* (2013.01); *H01L 29/66666* (2013.01); *H01L 29/78642* (2013.01)

(56) References Cited

U.S. PATENT DOCUMENTS

| | | | |
|---|---|---|---|
| 6,831,017 B1* | 12/2004 | Li | B82Y 10/00 257/E21.131 |
| 8,637,849 B2 | 1/2014 | Deligianni et al. | |
| 9,349,860 B1* | 5/2016 | Afzalian | H01L 29/7827 |
| 9,502,519 B2* | 11/2016 | Chen | H01L 29/7827 |
| 2002/0119636 A1 | 8/2002 | Chittipeddi | |
| 2005/0164454 A1 | 7/2005 | Leslie | |
| 2011/0012085 A1 | 1/2011 | Deligianni et al. | |
| 2014/0225184 A1 | 8/2014 | Colinge et al. | |
| 2015/0333078 A1* | 11/2015 | Colinge | H01L 21/28282 257/316 |
| 2015/0349059 A1 | 12/2015 | Vellianitis | |
| 2016/0149019 A1* | 5/2016 | Chen | H01L 29/66666 257/329 |
| 2016/0240533 A1* | 8/2016 | Oxland | H01L 27/092 |
| 2017/0125518 A1* | 5/2017 | Oxland | H01L 29/0676 |

OTHER PUBLICATIONS

Gandhi, Ramanathan et al., "Vertical Si-Nanowire n-Type Tunneling FETs With Low Subthreshold Swing (≤50 mV/decade) at Room Temperature", IEEE Electron Device Letters, vol. 32, No. 4, Apr. 2011, pp. 437-439.

* cited by examiner

SELF-ALIGNED NANOSTRUCTURES FOR SEMICONDUCTOR DEVICES

CROSS-REFERENCE TO RELATED APPLICATIONS

The present application is a non-provisional patent application claiming priority to European Patent Application No. EP 15201489.0, filed Dec. 21, 2015, the contents of which are hereby incorporated by reference.

FIELD OF THE DISCLOSURE

Disclosed embodiments relate to the field of vertical nanostructure semiconductor devices. More specifically the disclosed embodiments relate to a field-effect transistor (FET) based on one or more vertical nanowire channels and to methods to make and implement the same.

BACKGROUND

In the context of CMOS scaling, it is established that below 7-nm CMOS generation, i.e. sub N7, the standard planar/FinFET architecture needs to switch to a vertical type of integration in order to continue scaling. Furthermore, electrostatic control needs to be improved. One option is to develop an architecture based on gate-all-around (GAA) vertical nanowires.

For this purpose, a lower part and an upper part of a vertical semiconductor nanowire is typically surrounded by a dielectric while a central part of the vertical semiconductor nanowire is surrounded by a gate composed of a metal gate electrode separated from the nanowire by a gate dielectric. This central part of the vertical semiconductor nanowire will function as the channel in the FET. The formation of this layer stack (dielectric-gate-dielectric) surrounding the nanowire is particularly challenging.

Two types of approaches can be followed to this end.

The first approach is generally referred to as the "channel last" approach and consists in first forming the layer stack, wherein a sacrificial layer takes the place of the metal layer, then forming a vertical hole through that stack, followed by filling that hole with the semiconductor material of the nanowire to be formed, and finally, replacing the sacrificial layer by a gate composed of a metal layer and a dielectric layer separating the metal layer from the nanowire. The approach of making use of a sacrificial layer is referred to as the "replacement metal gate" (RMG) approach and can be used in both the "channel last" and the "channel first" approach (see below). The "channel last" approach suffers from several drawbacks. One of them being that the nanowire is grown in contact with the walls of the vertical hole. These walls are formed of two different materials, they can hardly be made perfectly regular, and the materials forming them typically presents a lattice mismatch with the material of the nanowire. As a result, the grown nanowire is typically full of defects.

The second approach is generally referred to as the "channel first" approach and consists in first forming the vertical semiconductor nanowire, followed by depositing the stack, layer by layer. The second layer can either be a sacrificial layer as in the first approach or can directly be a dielectric lining followed by a metal layer.

The "channel first" approach comes with its own set of challenges. Already the first dielectric layer is difficult to obtain in a controllable way. The applicant has tried the following approach with mitigated successes (unpublished results): it involved the formation of a hard mask cap on top of the nanowire, followed by the embedding of the nanowire in a thick dielectric layer, followed by the planarization of that dielectric layer, and finally etching the dielectric layer until only the desired bottom portion of the nanowire was covered. The etching step can be performed via a wet etch process or a dry etch process.

For a Si nanowire and a silicon nitride first dielectric layer, a $H_3PO_4$ based wet etch at elevated temperature has been tried as it selectively etches the silicon nitride. However, the obtained silicon nitride first layer had an irregular top surface as shown in the focused ion beam image of FIG. 20.

For a Si nanowire and a silicon nitride first dielectric layer, a plasma based dry-etch has been tried but it was slow, could hardly be made selective enough to avoid nanowire consumption, and it also led to an irregular top surface as shown on the focused ion beam image of FIG. 21.

Beside the issue of forming the bottom dielectric layer, the second layer (sacrificial or metal layer) turned out to be even more difficult to control. First, it had to be formed on the already irregular surface of the first dielectric layer. Second, during the formation of the second layer, a thick layer of sacrificial or metal embedding the nanowire was formed, followed by the planarization and etching of that layer. This etching step faced similar problems as faced in the etching of the first layer. In particular, the surface of the second layer (e.g. a metal) after the etch process was rough. Also, the etching tended not to be uniform and to damage the gate junction. Furthermore, the thickness of the second layer was hard to control resulting in an ill-controlled gate length. Needless to say that these problems are repeated for the obtaining of the third layer of the stack.

In addition to the above mentioned drawbacks, the "channel first" approach also suffers from an inability to form well-defined regions along the height of the nanowire. In particular, it might be desirable to have the bottom and top parts of the nanowire (which are surrounded by the first and third layers of the stack) doped, while the middle part of the nanowire (which is surrounded by the second layer of the stack) would remain undoped. Such a succession of doped and undoped regions is difficult to achieve, especially with sharp transitions. Last but not least, in order to have as much control as possible on the gate length, it is desirable that the second layer (i.e. the gate electrode or gate electrode to be) surrounds all the undoped region of the nanowire but only the undoped region of the nanowire in order to have an as much correspondence as possible between the height and vertical position of the undoped channel region of the nanowire with the thickness and vertical position of the sacrificial or metal gate layer. This would permit to have a very well defined gate length.

SUMMARY

It is an object of some embodiments to provide semiconductor devices and methods to obtain the same.

Some embodiments can allow for vertical field-effect transistors to be obtained.

Some embodiments allow semiconductor devices that have a defect-poor nanostructure (such as a nanowire) as the channel to be obtained. Since the nanostructure is grown with no contact or only limited contact with the walls of a template, the resulting nanostructure is defect-poor. At most, in some embodiments, one or more parts of the nanostructure are grown within a hole of a template which walls are at most 10 nm high.

Some embodiments provide electrostatic control in the channel of the transistor, thereby leading to low leakage current density. This control is at least partly due to an alignment between the height and position of the gate electrode and the height and position of the channel within the nanostructure. This is also at least partly due to the uniform thickness of the metal gate layer.

Some embodiments may reduce the area needed by the transistor on a wafer (due to the vertical architecture), thereby improving the density in electronic components.

Some embodiments allow a semiconductor device comprising a nanostructure composed of at least two parts, and, in some embodiments, at least three parts, of well-defined lengths to be obtained. Further, certain embodiments of the semiconductor device may comprise a number of layers corresponding to the number of nanostructure parts, wherein each layer closely matches the height and the vertical position of one part of the nanostructure. Typically, the difference in vertical position achieved for the top and bottom surface of each part compared to the top and bottom surface of each corresponding surrounding layer is at most 2 nm (e.g., at most 1 nm and less than 1 nm or even less than 0.5 nm). When the semiconductor device is a vertical field effect transistor, this permits a very well defined gate length.

In some embodiments, each layer of the semiconductor device can have an even thickness across its whole surface. For instance, for each layer, thickness measurements at any two points of the layer may be within 1 nm or 0.5 nm.

In some embodiments an RMG process can be enabled.

In some embodiments, different dopant concentrations and/or different materials for well-defined parts of the nanostructure can be enabled.

In some embodiments, no or only few lithographic steps are necessary. Further, in some embodiments, no or only few overlay issues arise.

Some embodiments can permit the formation of multi-gate channels.

In a first aspect, present embodiments relate to a method for forming a semiconductor device comprising the steps of:

Providing a semiconductor surface (6'),

Epitaxially growing on the semiconductor surface (6') and perpendicularly thereon a first part (8) of a III-V semiconductor nanostructure, the first part (8) having a top surface, Covering the first part (8) of the III-V semiconductor nanostructure with a layer (9) of a first material, Removing a top portion of the layer (9) of the first material in such a way that its top surface is co-planar with the top surface of the first part (8) of the III-V semiconductor nanostructure, thereby exposing the top surface of the first part (8) of the III-V semiconductor nanostructure, Epitaxially growing on the first part (8) of the III-V semiconductor nanostructure a second part (8') of the III-V semiconductor nanostructure, the second part (8') having a top surface, Covering the second part (8') of the III-V semiconductor nanostructure with a layer (9') of a second material, different from the first material, and Removing a top portion of the layer (9') of the second material in such a way that its top surface is co-planar with the top surface of the second part (8') of the III-V semiconductor nanostructure, thereby exposing the top surface of the second part (8') of the III-V semiconductor nanostructure.

In a second aspect, present embodiments relate to a semiconductor device obtainable by a method according to any embodiment of the first aspect. In particular it relates to a semiconductor device comprising:

A semiconductor surface (6'), a first part (8) of a III-V semiconductor nanostructure, abutting perpendicularly the semiconductor surface (6'), the first part (8) having a top surface and at least one side surface, a layer (9) of a first material covering the at least one side surface, the layer having a top surface co-planar with the top-surface of the first part (8) of the III-V semiconductor nanostructure, a second part (8') of the III-V semiconductor nanostructure, abutting perpendicularly the first part (8), the second part (8') having a top surface and at least one side surface, the second part (8') being made of a different material and/or being doped differently than the first part (8) of the III-V semiconductor nanostructure, and a layer (9') of a second material, different from the first material, covering the at least one side surface of the second part (8'), having a top surface co-planar with the top surface of the second part (8') of the III-V semiconductor nanostructure.

The above objective is accomplished by a method and device according to certain embodiments.

Particular aspects are set out in the accompanying independent and dependent claims. Features from the dependent claims may be combined with features of the independent claims and with features of other dependent claims as appropriate and not merely as explicitly set out in the claims.

These and other aspects will be exposed from and elucidated with reference to the embodiment(s) described hereinafter.

As used herein and unless provided otherwise, the term "nanostructure" refers to a structure having at least one of its dimensions (width, length or height) measuring at most 100 nm. In the context of certain embodiments, the nanostructure is typically a nanosheet or a nanowire.

As used herein and unless provided otherwise, the term "nanowire" relates to a nanostructure having the shape of a rod which longest dimension is at least twice as large as its shortest dimension. Typically, the nanowire may be of substantially uniform horizontal cross-section. Its horizontal cross-section may be as long as it is wide. For instance it may be circular or square. It may be circular. For instance, the at least one nanowire may have a width (and length) of from 1 to 50 nm (e.g., from 1 to 10 nm) and a height of from 80 to 300 nm (e.g., from 130 to 250 nm or from 160 to 220 nm).

As used herein and unless provided otherwise, the term "nanosheet" relates to a nanostructure having the shape of a sheet which longest dimension is at least twice as large as its shortest dimension. Typically, the nanosheet may be of substantially uniform horizontal cross-section. Its horizontal cross-section is longer than it is wide. For instance it may be at least twice as long as it is wide or at least ten times as long as it is wide. It could be rectangular. For instance, the at least one nanowire may have a width of from 1 to 50 nm (e.g., from 1 to 10 nm) a length at least twice as large as its width and a height of from 80 to 300 nm (e.g., from 130 to 250 nm or from 160 to 220 nm).

As used herein and unless provided otherwise, the term "III-V" when characterizing a material, refers to a material made of compounds consisting of at least one group-III (IUPAC group 13) element and at least one group-V element (IUPAC group 15). This includes binary compounds but also higher order compounds such as ternary compounds. Examples include but are not limited to GaAs, $In_xGa_{1-x}As$, InAs, GaSb, $In_xGa_{1-x}Sb$, and InSb wherein $0<x<1$. Binary compounds may be used because their stoichiometry is easier to control.

As used herein and unless provided otherwise, the term "group IV" when characterizing a material, refers to a material made of at least one group IV element (IUPAC group 14). Examples of group IV materials are Si, Ge and $Si_xGe_{1-x}$ wherein $0<x<1$.

As used herein and unless provided otherwise, the term "doped" refers to the nature and concentration of impurities in a semiconductor material that alter its electrical properties. Two semiconductor materials being doped differently will therefore refer to two semiconductor materials, each being doped by different dopant and/or by different dopant concentration.

As used herein and unless provided otherwise, a doped semiconductor material relates to a semiconductor material which dopant level is higher than 1e19 at/cm$^3$.

As used herein and unless provided otherwise, an undoped (or non-doped or intrinsic) semiconductor material relates to a semiconductor material which dopant level is lower than 1e17 at/cm$^3$.

Figure 1:
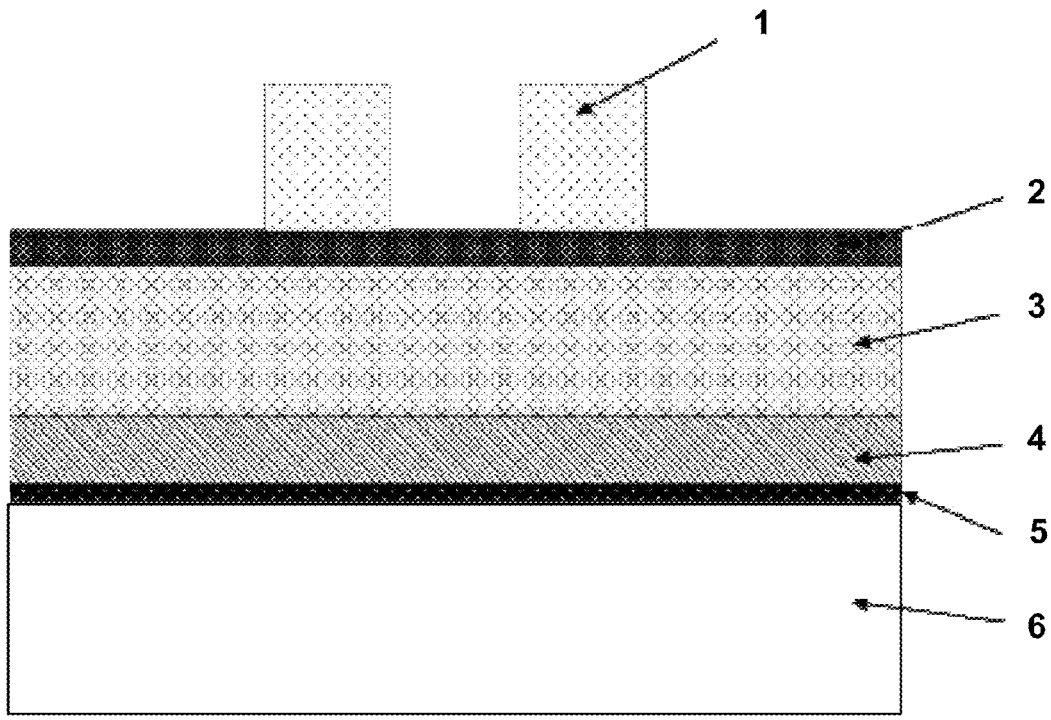
FIG. 1 is a schematic representation of a process step, as used to form a substrate, according to example embodiments.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be exposed to one of ordinary skill in the art from this disclosure, in one or more embodiments.

Similarly it should be appreciated that in the description of example embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures and techniques have not been shown in detail in order not to obscure an understanding of this description.

Figure 22:
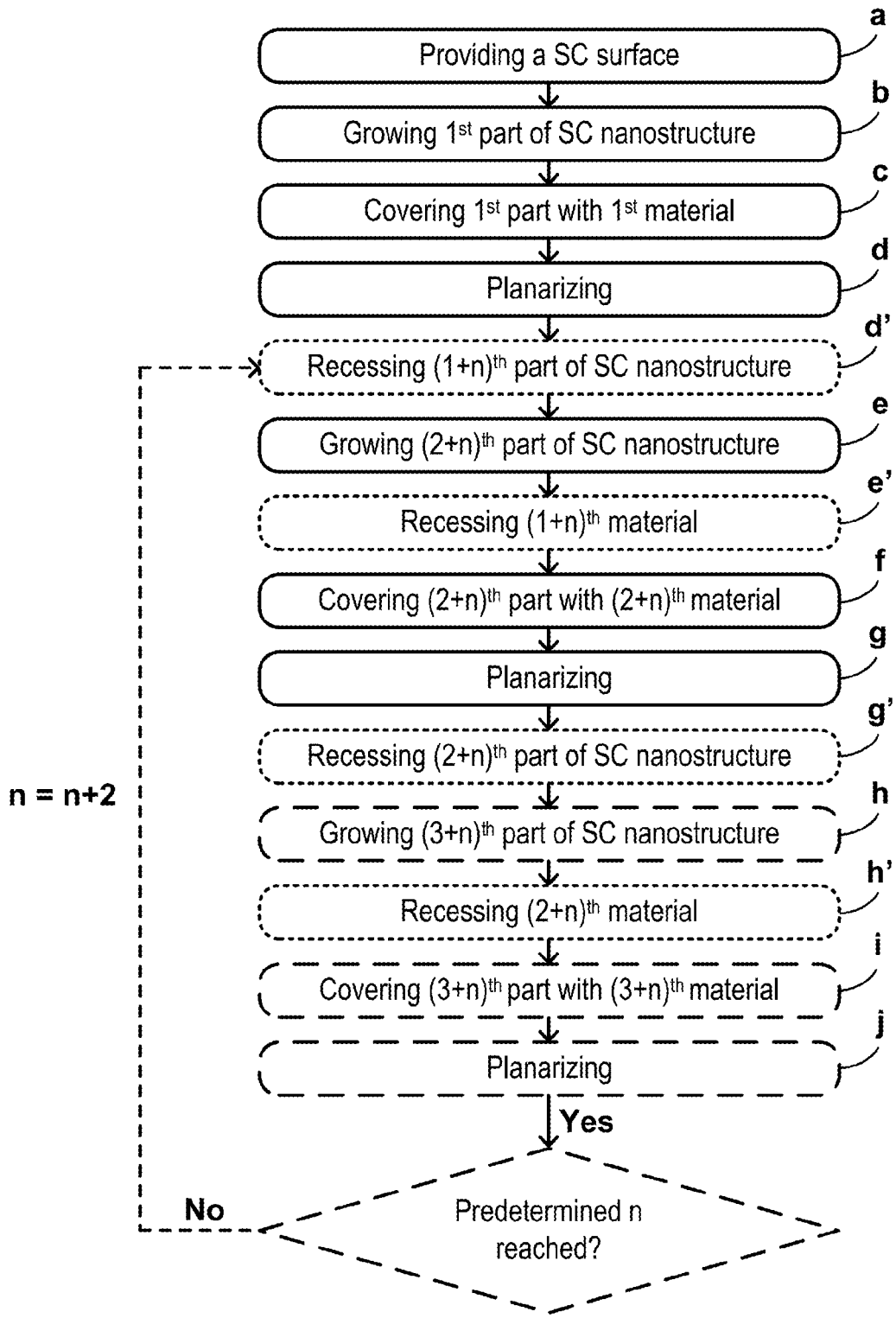
FIG. 22 is a flowchart illustrating a method, according to example embodiments.

In a first aspect, the present invention refers to a method for forming a semiconductor device. An embodiment thereof is depicted in FIGS. 8 to 17. A flowchart summarizing several embodiments is depicted in FIG. 22. In that flowchart, optional steps are indicated with dashed or dotted lines. Steps enclosed by dotted lines typically occur in the same embodiments. Steps enclosed by dashed lines typically occur in the same embodiments.

Figure 8:
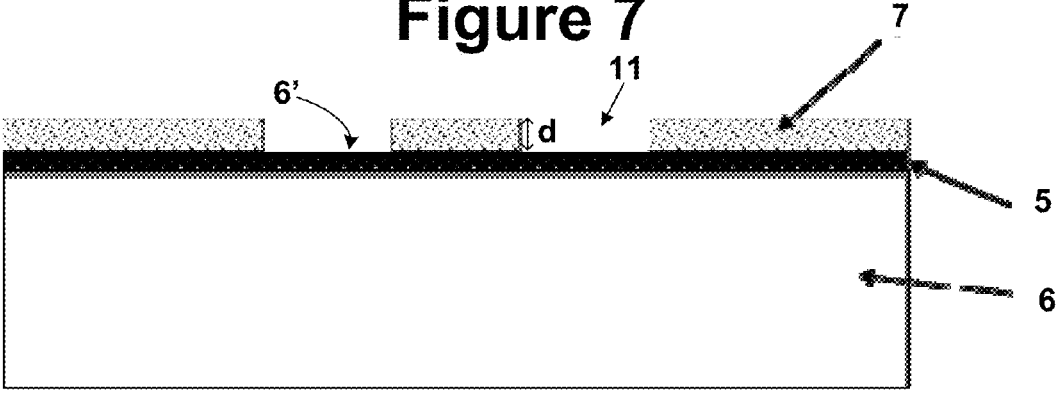
FIG. 8 is a schematic representation of a process step, as used to form a substrate, according to example embodiments.

We now refer to FIG. 8.

FIG. 8 schematically shows the end result of step a of providing a semiconductor surface (6') according to an embodiment. The semiconductor surface (6') can be made of a monocrystalline semiconductor material. In embodiments, the substrate (10) may belong to a semiconductor substrate (6). For instance, it may belong to a bulk monocrystalline Group IV semiconductor substrate (6) or a Group III/V binary compound semiconductor substrate (6).

In embodiments, the surface (6') may have Miller indices (1,1,1). Using such a substrate surface can be advantageous as it permits growing thereon a nanowire having a bottom surface sharing the same Miller indices (1,1,1), thereby permitting the growth of the at least one nanowire vertically on the first surface (6').

In embodiments, the substrate (6) may be a (1,1,1) oriented bulk monocrystalline Group IV semiconductor substrate (6) or a (1,1,1)B oriented Group III/V binary compound semiconductor substrate (6) or may even be a (1,1,1)B oriented Group III/V ternary or quaternary compound semiconductor (6).

In embodiments, the bulk (1,1,1) oriented monocrystalline Group IV semiconductor substrate may be a bulk (1,1,1) oriented silicon or a bulk (1,1,1) oriented germanium substrate.

In some embodiments, the bulk (1,1,1)B oriented monocrystalline Group III/V compound semiconductor substrate may be a (1,1,1)B oriented binary Group III/V semiconductor material such as for example, gallium arsenide (GaAs), indium phosphide (InP), indium arsenide (InAs), gallium phosphide (GaP), gallium antimonide (GaSb) or indium indium antimonide (InSb).

It can be advantageous to have a (1,1,1) oriented Group IV semiconductor material or a (1,1,1)B oriented Group III/V compound semiconductor material since they facilitate the growth of vertical nanostructures such as vertical nanowires or vertical nanosheets. Growing vertical nanostructures can allow for further scaling of feature sizes and increasing device density in semiconductor industry.

Visible in FIG. 8 are a semiconductor substrate (6) covered with an optional template layer (5, 7) comprising a through-hole (11) exposing the semiconductor surface (6'), the through-hole (11) having a horizontal cross-section corresponding to the horizontal cross-section of the nanostructure to be grown in step b. The optional template layer (5, 7) can be a single layer or a multilayer. In the embodiment depicted in FIG. 8, it is a bilayer (5, 7). A variety of materials can be used to form the template layer. For example, the template layer is made of a dielectric material. In embodiments, the dielectric material may be an oxide or nitride.

In embodiments, the oxide may be a silicon oxide. In embodiments, the silicon oxide may be High Density Plasma oxide (HDP), a Plasma Enhanced Chemical Vapor Deposited oxide. In order to improve the quality of the silicon oxide, a thermal annealing process may be performed thus, densifying the silicon oxide. The thermal treatment process may, for example, be performed using $H_2O$ at 750° C. with a duration of 30 minutes followed by exposure to $N_2$ atmosphere at 1050° C. with a duration of 30 minutes. When a HDP oxide is used, the thermal annealing may be optional.

In embodiments, the nitride may be a silicon nitride. The silicon nitride may be deposited by performing a Plasma Enhanced Chemical Vapor Deposition (PE-CVD) process or a Low Pressure Chemical Vapor Deposition (LP-CVD) process.

In embodiments, the silicon nitride may be $Si_3N_4$.

In embodiments, the silicon oxide may be $SiO_2$.

For instance, in the bilayer of FIG. 8, both layers can be made of $SiO_2$.

The presence of the optional template layer (5, 7) can help control the lateral extend of the nanostructure growth.

In embodiments, the (horizontal cross-section of the) through-hole may be as long as it is wide. For instance it may be circular or square. It can be circular. The (horizontal cross-section) of the through-hole may also be oblong. For instance the through-hole may be a trench. This permits to grow a vertical nanosheet or a fin structure. In some embodiments, the through-hole is as long as it is wide. This can permit the growth of a vertical nanowire. The method of the first aspect is particularly useful to control the gate length of field effect transistors based on vertical nanowires.

In embodiments, the depth d of the through-hole (11) may be at most 10 nm. In certain embodiments, the depth d may be in the range of 5 nm to 10 nm.

It can be advantageous to have the depth d of at most 10 nm. For example, the depth d may be in the range of 5 nm to 10 nm due to that fact that a depth d higher than 10 nm may result in a high density of defect formation in the nanostructure grown in the through-hole (11). The defects may include misfit or threading dislocations that may originate due to lattice mismatch between the vertical semiconductor nanostructure and the sidewalls of the through-hole (11). The defects may also include point defects, such as for example interstitials, vacancies or anti-sites, due to the presence of impurities such as for example, dopant elements. The high density of defect formation during the growth of a vertical nanostructure in a through-hole having a depth higher than 10 nm increases the risk of having the defects in a channel region of the vertical nanostructure. This may lead to device performance-related issues when a vertical field effect transistor is fabricated using such a vertical nanostructure.

We now give a non-limitative example of how the semiconductor substrate of FIG. 8 can be formed. This is depicted in FIGS. 1-8.

FIG. 1 shows the end result of a process involving the following steps:

Providing a semiconductor surface (6'),

Overlaying the semiconductor surface (6') with a silicon dioxide layer (5) (for instance with a thickness of 3 nm), Overlaying the silicon dioxide layer (5) with an amorphous silicon layer (4) (for instance with a thickness of 40 nm), Overlaying the amorphous silicon layer (4) with of an amorphous carbon layer (3) (for instance an advanced patterning film (APF) with a thickness of 70 nm), Overlaying the amorphous carbon layer (3) with an anti-reflective coating (2) (for instance a SiOC film with a thickness of 20 nm), and Providing a patterned photoresist (1) on the anti-reflective coating (2).

Figure 2:
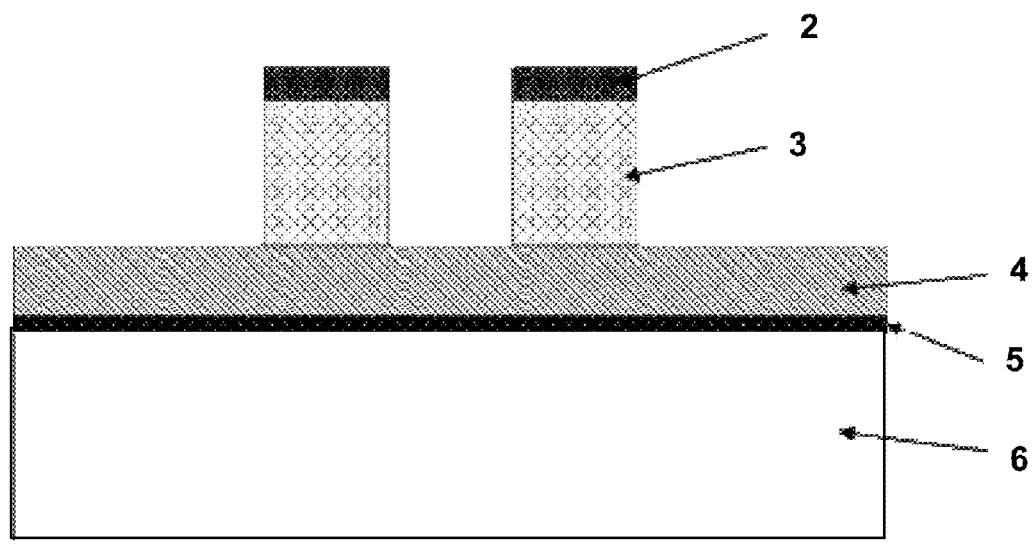
FIG. 2 is a schematic representation of a process step, as used to form a substrate, according to example embodiments.

FIG. 2 shows the end result of a step of transferring the pattern of the photoresist (1) into the anti-reflective film (2) and the amorphous carbon film (3).

Figure 3:
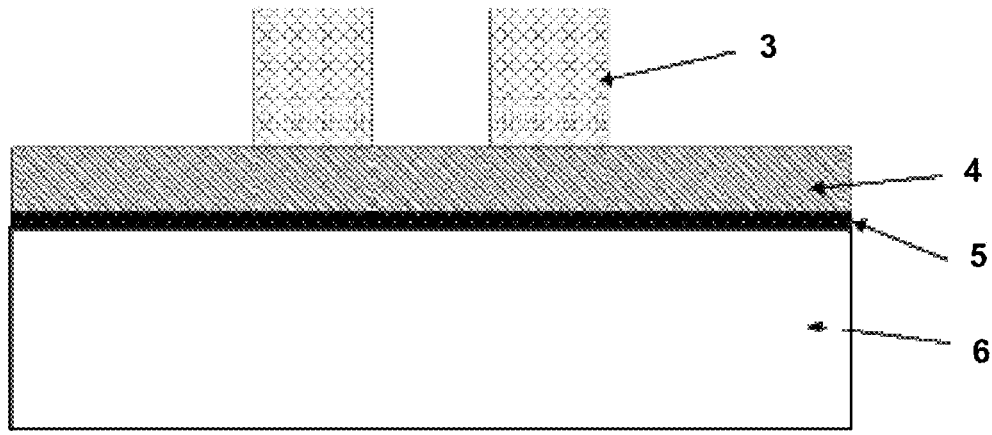
FIG. 3 is a schematic representation of a process step, as used to form a substrate, according to example embodiments.

FIG. 3 shows the end result of a step of removing the anti-reflective film (2) from the patterned amorphous carbon film (3).

Figure 4:
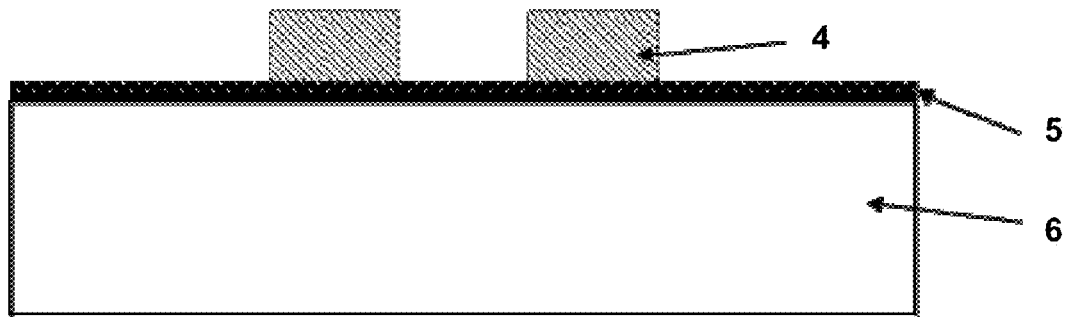
FIG. 4 is a schematic representation of a process step, as used to form a substrate, according to example embodiments.

FIG. 4 shows the end result of a step of transferring the pattern of the patterned amorphous carbon film (3) into the amorphous silicon (4).

Figure 5:
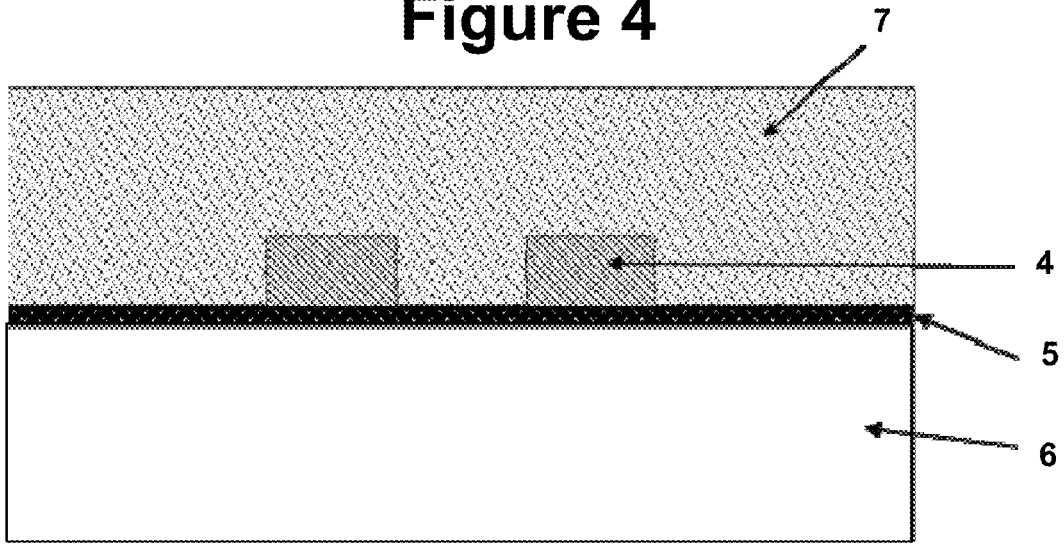
FIG. 5 is a schematic representation of a process step, as used to form a substrate, according to example embodiments.

FIG. 5 shows the end result of a step of covering the amorphous silicon pattern (4) with a layer of $SiO_2$ (7).

Figure 6:
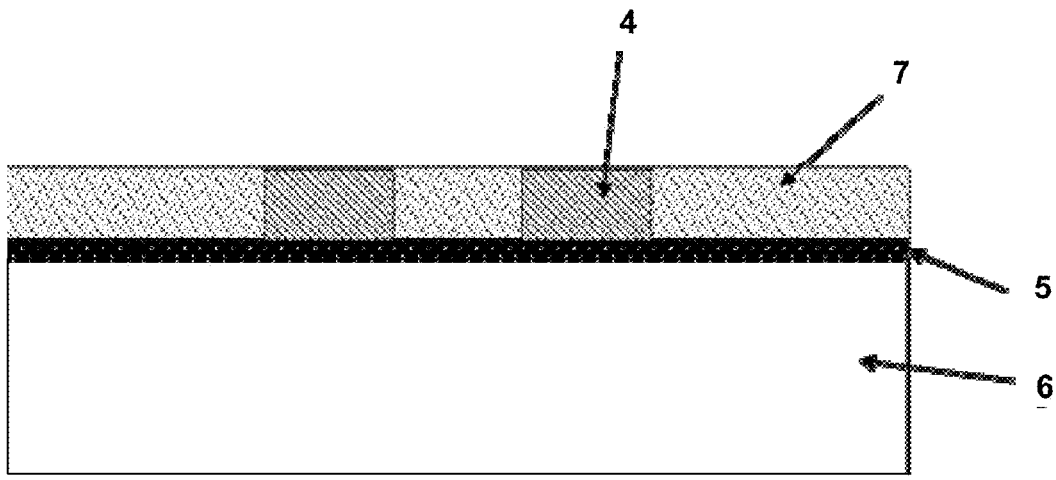
FIG. 6 is a schematic representation of a process step, as used to form a substrate, according to example embodiments.

FIG. 6 shows the end result of a step of removing a top portion of the layer of $SiO_2$ (7) by chemical mechanical planarization.

Figure 7:
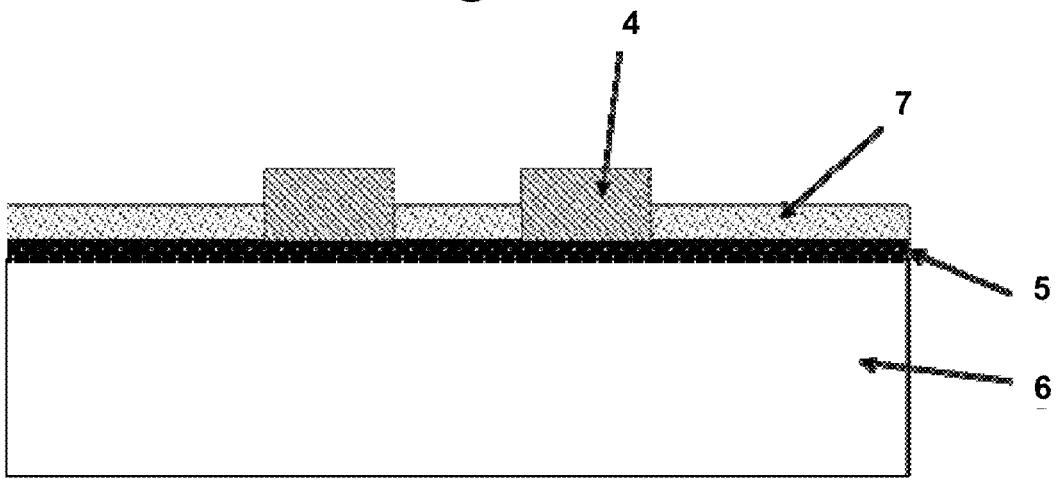
FIG. 7 is a schematic representation of a process step, as used to form a substrate, according to example embodiments.

FIG. 7 shows the end result of a step of exposing the layer of $SiO_2$ (7) to a wet etch until the wished thickness for the combination of both silicon dioxide layer (5, 7) is achieved.

FIG. 8 shows the end result of a step of removing the amorphous silicon pattern (4), thereby providing holes, followed by etching the bottom of the holes until the semiconductor surface (6') is obtained. The through-holes (11) are thereby obtained.

We now return to the main steps of the first aspect. After the semiconductor surface (6') is provided, a step b is performed wherein a first part (8) of a III-V semiconductor nanostructure is grown epitaxially on the semiconductor surface (6'). This first part of the III-V semiconductor nanostructure is grown perpendicularly to the surface (6'). The first part (8) of the III-V semiconductor nanostructure has a top surface and at least one side surface.

Figure 9:
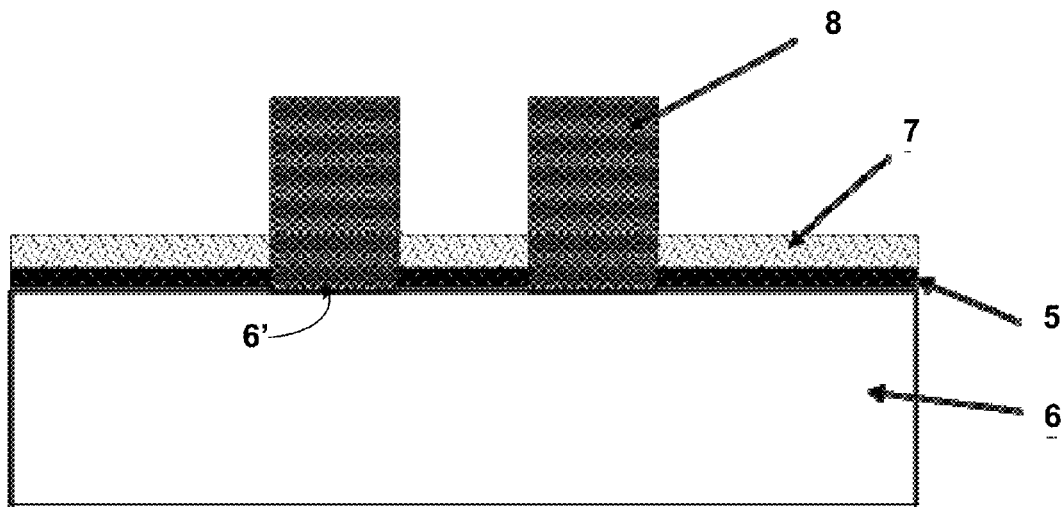
FIG. 9 is a schematic representation of a process step, as used to form a semiconductor device, according to example embodiments.

FIG. 9 schematically shows the end result of step b. On this Figure, we can see the first part (8) of the III-V semiconductor nanostructure abutting perpendicularly on the semiconductor surface (6').

In embodiments, the first part (8) of the III-V semiconductor nanostructure may be doped, thereby being electrically conductive. This can be advantageous as it permits this first part to serve as a source or a drain in a field effect transistor.

In embodiments, the height of the first part (8) of the III-V semiconductor nanostructure may be from 30 to 200 nm (e.g., from 40 to 100 nm or from 60 to 80 nm). These dimensions correspond to the dimensions of either the source or the drain region of vertical nanowire-based FET investigated in the current technology node. Of course, some embodiments will be applicable to future technology nodes as well so that smaller dimensions are also compatible with some embodiments.

Figure 10:
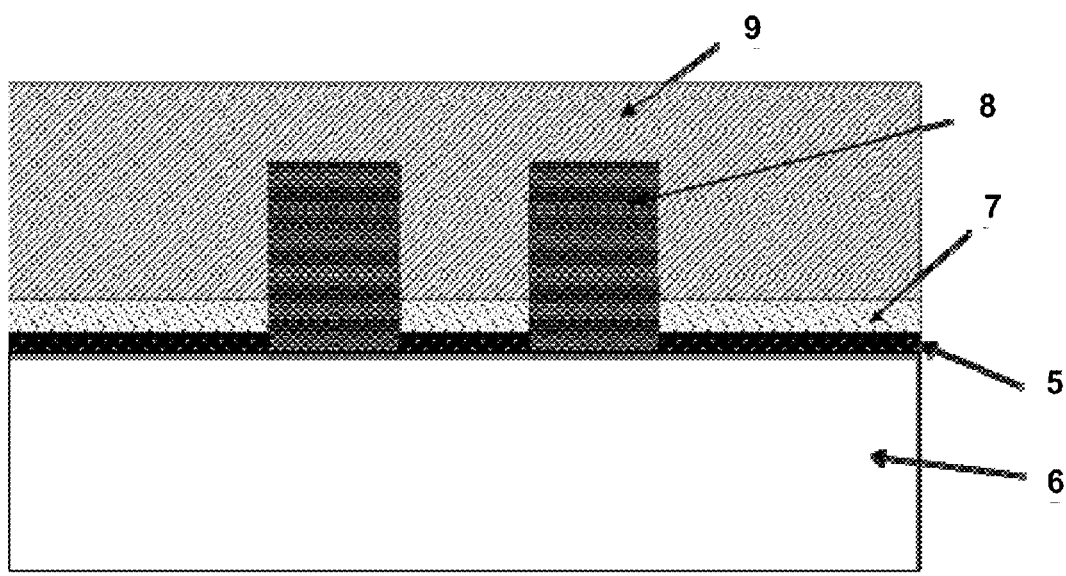
FIG. 10 is a schematic representation of a process step, as used to form a semiconductor device, according to example embodiments.

We now refer to FIG. 10 which shows the end-result of step c where the first part (8) of the III-V semiconductor nanostructure is covered with a layer (9) of a first material. In embodiments, the first material may be a dielectric material. The use of a dielectric material can be advantageous for instance when the semiconductor device is a field effect transistor and when the first part of the nanostructure is destined to be used as a source or a drain for the transistor. In that case, it can be advantageous to isolate the source or the drain from its surrounding by surrounding its sidewalls with a dielectric material. If the second material is a sacrificial material, the first material can be selected in such a way that, it can be etched selectively with respect to the first material and with respect to the first part of the III-V semiconductor nanostructure. This can be advantageous as it permits the second material to be replaced by a gate (gate dielectric and gate electrode) without affecting the first material. For instance, the first material may be silicon nitride ($Si_3N_4$) if the second material is silicon oxide. Indeed, silicon oxide can be wet etched selectively with respect to silicon nitride and with respect to group III/V materials. Another option is to use silicon oxide as the first material and to use amorphous silicon as the second material. Indeed, amorphous silicon can be wet etched selectively with respect to silicon oxide and with respect to group III/V materials.

In embodiments, the silicon oxide may be High Density Plasma oxide (HDP) or a Plasma Enhanced Chemical Vapor Deposited oxide. In order to improve the quality of the silicon oxide, a thermal annealing process may be performed thus, densifying the silicon oxide. The thermal treatment process may, for example, be performed using $H_2O$ at 750° C. with a duration of 30 minutes followed by exposure to $N_2$ atmosphere at 1050° C. with a duration of 30 minutes. When a HDP oxide is used, the thermal annealing may be optional.

In embodiments, the silicon nitride may be deposited by performing a Plasma Enhanced Chemical Vapor Deposition (PE-CVD) process or a Low Pressure Chemical Vapor Deposition (LP-CVD) process.

In embodiments, amorphous silicon can be deposited by any process known to the person skilled in the art such as for instance Chemical Vapor Deposition (CVD) or sputtering.

Figure 11:
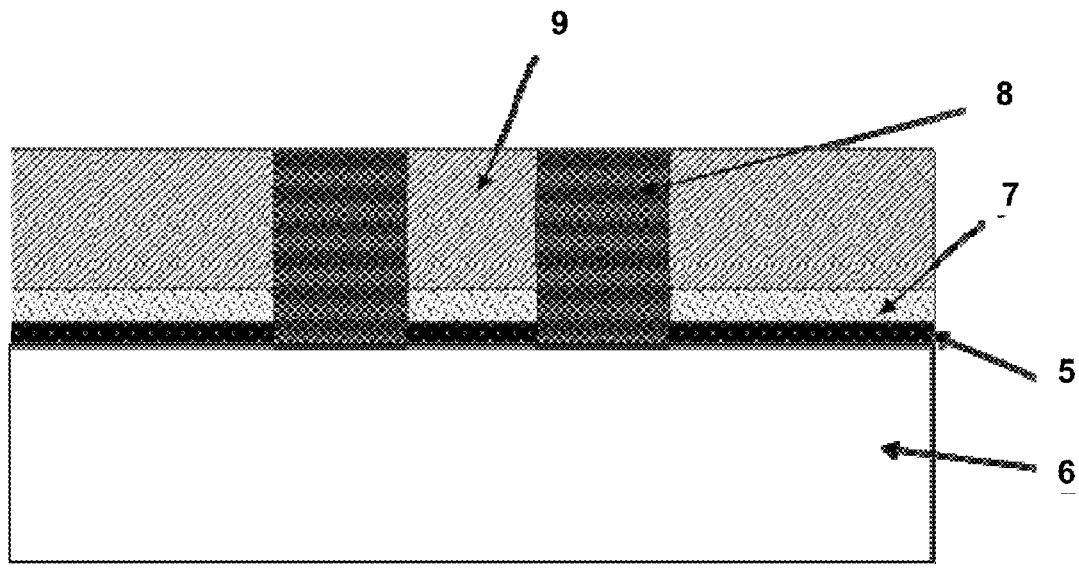
FIG. 11 is a schematic representation of a process step, as used to form a semiconductor device, according to example embodiments.

We now refer to FIG. 11 which shows the end result of step d in an embodiment of the first aspect. In this figure, a top portion of the layer (9) of the first material has been removed in such a way that its top surface is co-planar with the top surface of the first part (8) of the III-V semiconductor nanostructure, thereby exposing the top surface of the first part (8) of the III-V semiconductor nanostructure. This step can be advantageous as it enable the height reached by the layer (9) of first material to correspond exactly to the height reached by the first part (8) of the III-V semiconductor nanostructure. This means that when the second part (8') of the III-V semiconductor nanostructure will have been grown, its sidewalls will not be embedded at all by the layer (9) of first material. This in turn permits that at the end of step g, the height and vertical positioning of the layer (9') of second material correspond exactly to the height and vertical positioning of the second part (8'). When the semiconductor device is a vertical field effect transistor, this permits an unprecedented control over the gate length and an exact correspondence between channel and gate length. In embodiment, step d of removing a top portion of the layer of the first material may be performed by chemical mechanical planarization.

We will now discuss a special embodiment. It may occasionally happen that step d damages the top surface of the first part (8) of the III-V semiconductor nanostructure. In such a case, it may be advantageous to perform a step d', after step d and before step e, of removing a top portion of thickness t1 of the first part (8) of the III-V semiconductor nanostructure. Even when the top surface of the first part (8) is not damaged, it may be advantageous to perform step d' since the result of this step is that the top surface of the first part (8) of the III-V semiconductor nanostructure now lies lower than the top surface of the layer (9) of first material. Although this will be corrected after step e, this difference in level between both top surfaces causes the layer (9) of first material to become a template for the subsequent growth of the second part (8') of the III-V semiconductor nanostructure.

Figure 18:
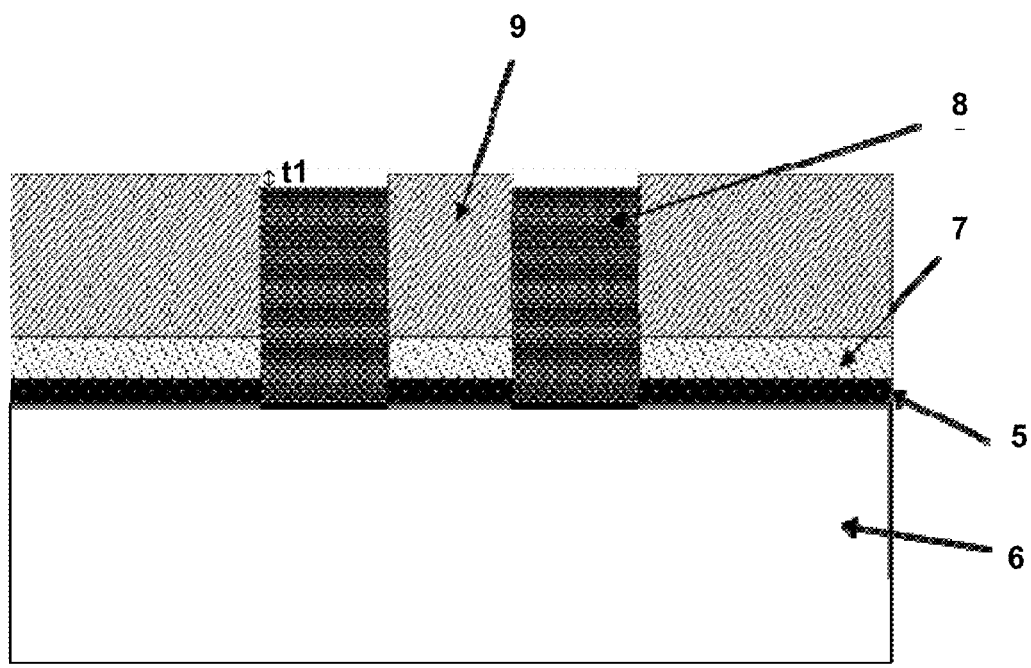
FIG. 18 is a schematic representation of an end result of an optional process step performed after the step leading to FIG. 11, according to example embodiments.

The end result of that step is depicted for an embodiment in FIG. 18.

In embodiments, the thickness t1 may be from 1 to 10 nm (e.g., from 2 to 5 nm). This is typically sufficient to remove damages and can be useful for controlling the lateral extend of the nanostructure growth. It can be advantageous to have the thickness t1 of from 1 to 10 nm due to that fact that a thickness t1 higher than 10 nm may result in a high density of defect formation of vertical Group III/V semiconductor nanostructure grown in the cavity caused by step d'. A possible advantage of the range from 2 to 5 nm is that it is on one hand large enough to serve as very efficient template but not that large as to introduce irregularities in the top surface of the layer of first material (9).

In embodiments, removing a top portion of thickness t1 of the first part (8) of the III-V semiconductor nanostructure may comprise exposing the top surface of the first part (8) of the III-V semiconductor nanostructure to a wet etching solution. A convenient way to do this is to select a wet etching solution which can selectively etch the first part (8) of the III-V semiconductor nanostructure with respect to the layer (9) of first material.

In embodiments, when a step d' has been performed, a step e' is performed after step d' and before step f, of removing a top portion of thickness t1 of the layer (9) of a first material. For instance, step e' may be performed between step e and step f (the end result of that step can, like the end result of step e, be represented by FIG. 12) or between step d' and step e (the end result of that step can, like the end result of step d, be represented by FIG. 11). If step e' is performed between step e and step f, this permits step e to occur in a template formed of the layer of first material and of the recessed first part of the III-V semiconductor nanostructure. This template, although perhaps advantageous, is not necessary.

We now revert back to the main flow of the process.

Figure 12:
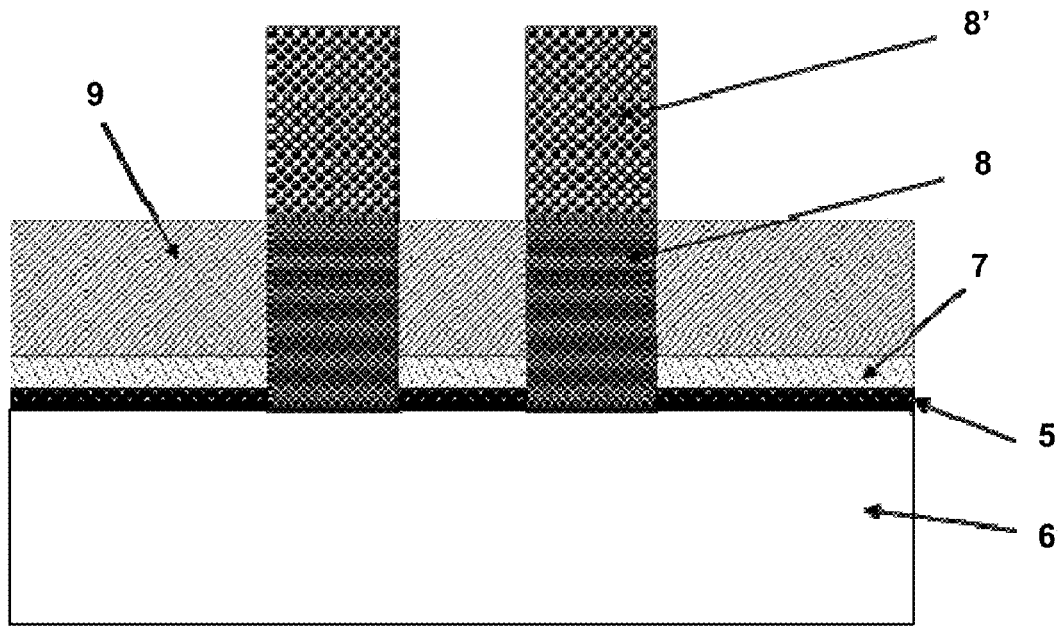
FIG. 12 is a schematic representation of a process step, as used to form a semiconductor device, according to example embodiments.

We now refer to FIG. 12 which shows the end result of step e in an embodiment of the first aspect. In this figure, a second part (8') of the III-V semiconductor nanostructure is epitaxially grown on the first part (8) of the III-V semiconductor nanostructure, the second part (8') having a top surface. The second part may be made of a different material and/or may have a different doping than the first part (8) of the III-V semiconductor nanostructure. It is typically grown perpendicularly to the top surface of first part (8) and of the layer (9) of first material. In embodiments, the height of the second part (8') of the III-V semiconductor nanostructure may be from 20 to 100 nm (e.g., from 30 to 70 nm or from 40 to 60 nm).

In embodiments, the second part (8') of the III-V semiconductor nanostructure is not doped. This can be advantageous when the III-V semiconductor device is a vertical field effect transistor and when the second part (8') will correspond to the channel of the transistor.

Figure 13:
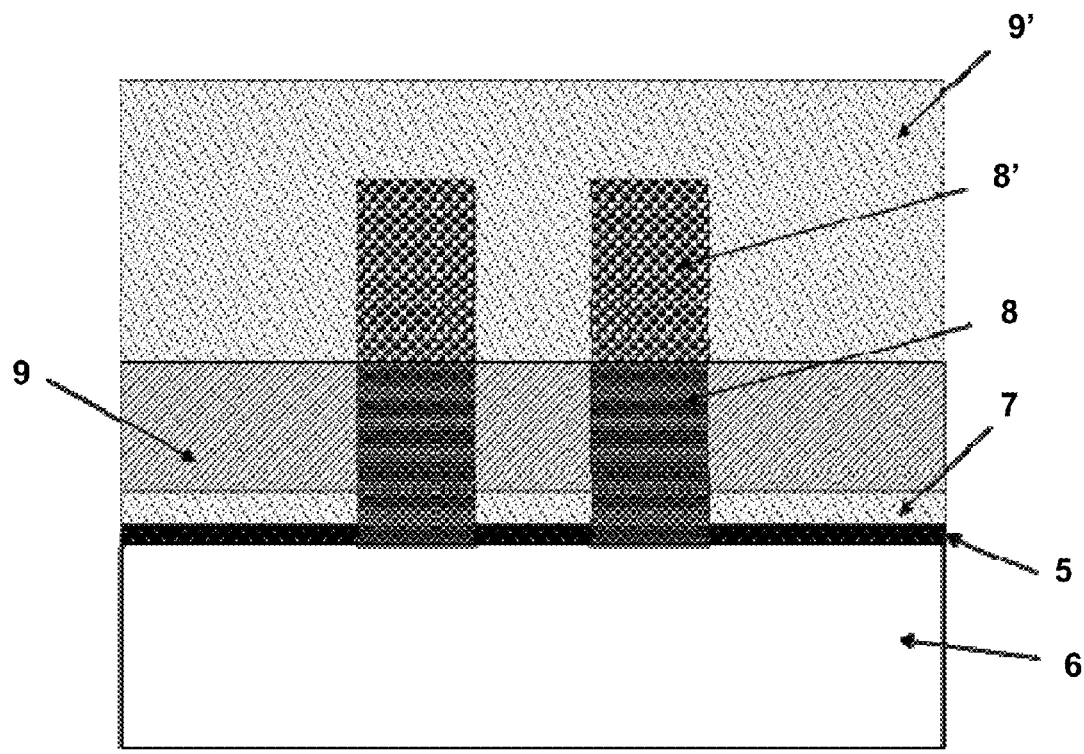
FIG. 13 is a schematic representation of a process step, as used to form a semiconductor device, according to example embodiments.

We now refer to FIG. 13 which shows the end result of step f in an embodiment of the first aspect. In this figure, the second part (8') of the III-V semiconductor nanostructure has been covered with a layer (9') of a second material, different from the first material.

In embodiments, the second material may be a sacrificial material that can be removed selectively with respect to the first material and the first part of the III-V semiconductor nanostructure (and the third material if present). Using a sacrificial material instead of using directly the target material intended for use as the second material in the final device can be advantageous when the presence of the target material is susceptible to contaminate the third part of the III-V semiconductor nanostructure. This is typically the case when the target material is a conductive material such as a metal. In embodiments, the sacrificial material may be silicon dioxide. This can be advantageous when the layer (9) of first material is silicon nitride since wet etching chemistries selective for the etching of silicon dioxide with respect to silicon nitride and III-V materials are well known to the person skilled in the art. In other embodiments, the sacrificial material may be amorphous silicon (a-Si). This can be advantageous when the layer (9) of first material is silicon dioxide since wet etching chemistries selective for the etching of amorphous silicon (a-Si) with respect to silicon dioxide and III-V materials are well known to the person skilled in the art.

In other embodiments, the second material may directly be a conductive material. If the second material is a conductive material, the method typically further comprises a step e'', after step e (and e' if present) and before step f, of covering the second part (8') of the III-V semiconductor nanostructure with a dielectric film (not depicted in the Figures). The dielectric film can be deposited conformally on the second part (8') of the III-V semiconductor nanostructure and typically also on the top surface of the layer (9) of first material. This conformal deposition can for instance be performed by atomic layer deposition (ALD). The purpose of using a conductive material as the second material is typically to have this second material serving as a gate electrode in a field effect transistor. In such cases, the dielectric film serves the role of the gate dielectric. After step e'' and before step f, a further step e''' of covering the dielectric film with a work function alignment film may be performed. The conductive material can be a metal. In some embodiments, it is W. The dielectric film can be a high-k dielectric film (e.g. an oxide of Al, Zr, Hf, Gd or La) and can alternatively be hafnium oxide. When W is used for the gate electrode, the work function alignment film may for instance be TiN or TiW. When the semiconductor device is a vertical field effect transistor, a gate electrode can be formed around the sidewalls of the second part (8') of the III-V semiconductor nanostructure. In that case, the conductive material could fulfil the role of gate electrode or the sacrificial material could in a further step be replaced by a conductive material, thereby forming a gate electrode.

The thickness of the layer of second material corresponds to the length of the gate of the transistor.

Figure 14:
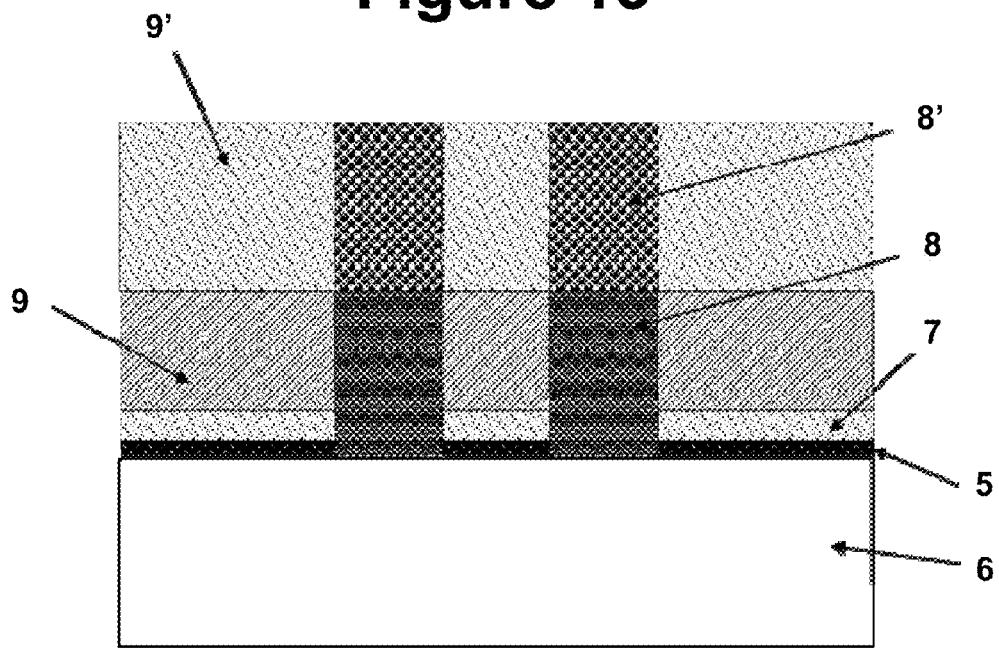
FIG. 14 is a schematic representation of a process step, as used to form a semiconductor device, according to example embodiments.

We now refer to FIG. 14 which shows the end result of step g in an embodiment of the first aspect. In this figure, a top portion of the layer (9') of the second material may be removed in such a way that its top surface is co-planar with the top surface of the second part (8') of the III-V semiconductor nanostructure, thereby exposing the top surface of the second part (8') of the III-V semiconductor nanostructure.

This step can enable the height reached by the layer (9') of the second material to correspond exactly to the height reached by the second part (8') of the III-V semiconductor nanostructure. This means that if a third part (8") of the III-V semiconductor nanostructure will be grown, its sidewalls will not be embedded at all by the layer (9') of second material. The height and vertical positioning of the layer (9') of second material therefore corresponds exactly to the height and vertical positioning of the second part (8'). When the semiconductor device is a vertical field effect transistor, this permits an unprecedented control over the gate length and an exact correspondence between channel and gate length. In embodiment, step g of removing a top portion of the layer of the first material may be performed by chemical mechanical planarization.

We will now discuss a special embodiment. It may occasionally happen that step g damages the top surface of the second part (8') of the III-V semiconductor nanostructure. In such a case, it may be advantageous to perform a step g', after step g and before step h, of removing a top portion of thickness t2 of the second part (8') of the III-V semiconductor nanostructure. Even when the top surface of the second part (8') is not damaged, it may be advantageous in some embodiments to perform step g' since the result of this step is that the top surface of the second part (8') of the III-V semiconductor nanostructure now lies lower than the top surface of the layer (9') of second material. Although this will be corrected in a later step, this difference in level between both top surfaces can be used to make from the layer (9) of second material a template for the subsequent growth of the third part (8") of the III-V semiconductor nanostructure.

Figure 19:
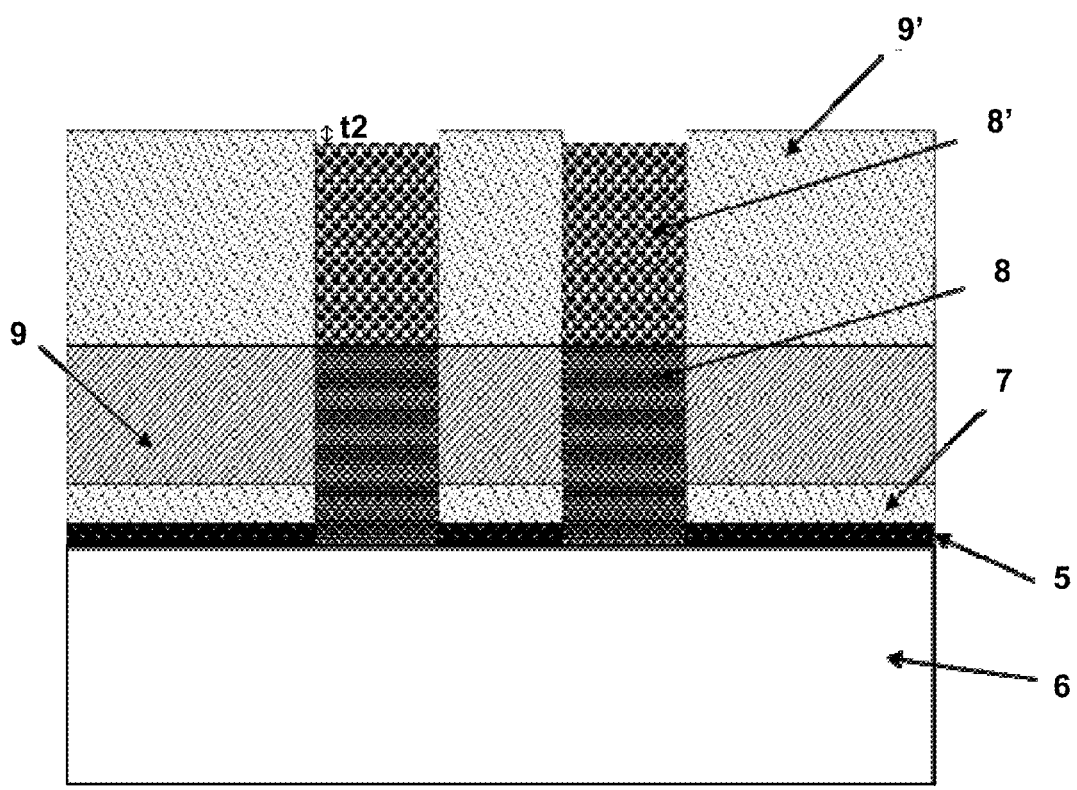
FIG. 19 is a schematic representation of an end result of an optional process step performed after the step leading to FIG. 14, according to example embodiments.
Figure 20:
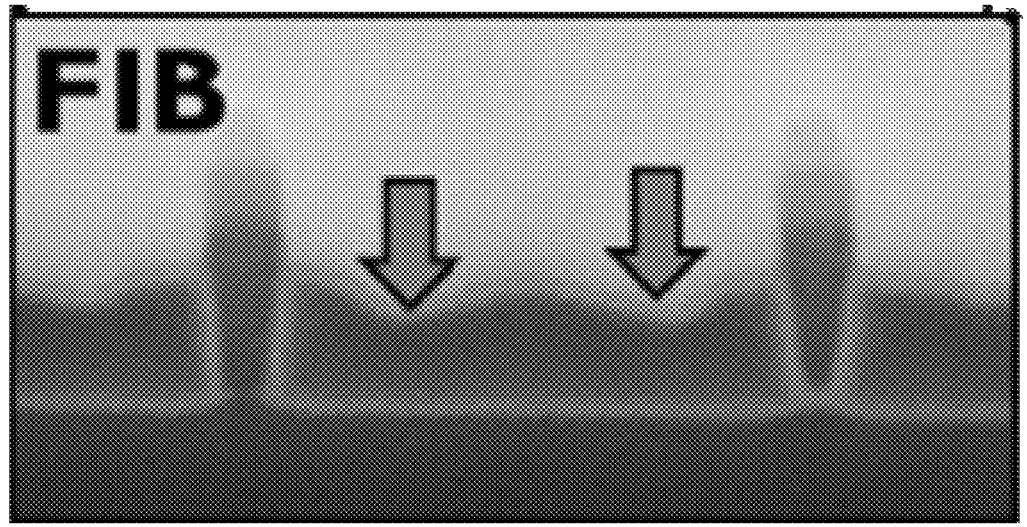
FIG. 20 is a focused ion beam image illustrating an end result of a deposition of a silicon nitride first dielectric layer over a Si nanowire, followed by a wet etch at elevated temperature as tried in a comparative experiment.
Figure 21:
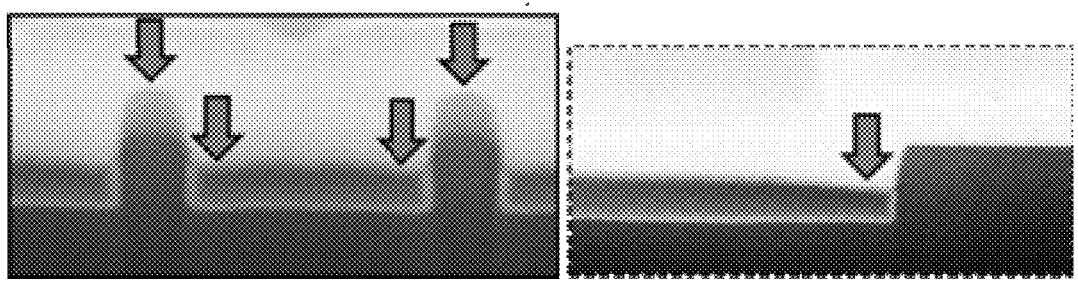
FIG. 21 is a focused ion beam image illustrating an end result of a deposition of a silicon nitride first dielectric layer over a Si nanowire, followed by a plasma based dry-etch as tried in a comparative experiment.

The end result of that step g' is depicted for an embodiment in FIG. 19.

In embodiments, the thickness t2 may be from 1 to 10 nm (e.g., from 2 to 5 nm or from 2 to 3 nm).

This is typically sufficient to remove damages can be ideal for controlling the lateral extend of the growth of the third part (8") of the III-V semiconductor nanostructure. It can be advantageous to have the thickness t2 of from 1 to 10 nm due to that fact that a thickness t2 higher than 10 nm may result in a high density of defect formation of vertical Group III/V semiconductor nanostructure grown in the cavity caused by step g'. A possible advantage of the range from 2 to 5 nm is that it is on one hand large enough to serve as very efficient template but not that large as to introduce irregularities in the top surface of the layer of second material (9').

In embodiments, removing a top portion of thickness t2 of the second part (8') of the III-V semiconductor nanostructure may comprise exposing the top surface of the second part (8') of the III-V semiconductor nanostructure to a wet etching solution. A convenient way to do this is to select a wet etching solution which can selectively etch the second part (8) of the III-V semiconductor nanostructure with respect to the layer (9') of second material.

In embodiments, when a step g' has been performed, a step h' may be performed after step g' and before step i (e.g. between step g' and step h or between step h and step i), of removing a top portion of thickness t2 of the layer (9') of a second material. The end result if this step h' is performed between step g' and step h can, like the end result of step g, be represented by FIG. 14. The end result if this step h' is performed between step h and step I can, like the end result of step h, be represented by FIG. 15.

Although some advantages of the method of the first aspect are already present when only two parts (8, 8') of a III-V semiconductor nanostructure are formed and two layers (9, 9') of different materials are formed, some embodiments will be used to form semiconductor devices having at least a third part (8") and a third layer (9").

Figure 15:
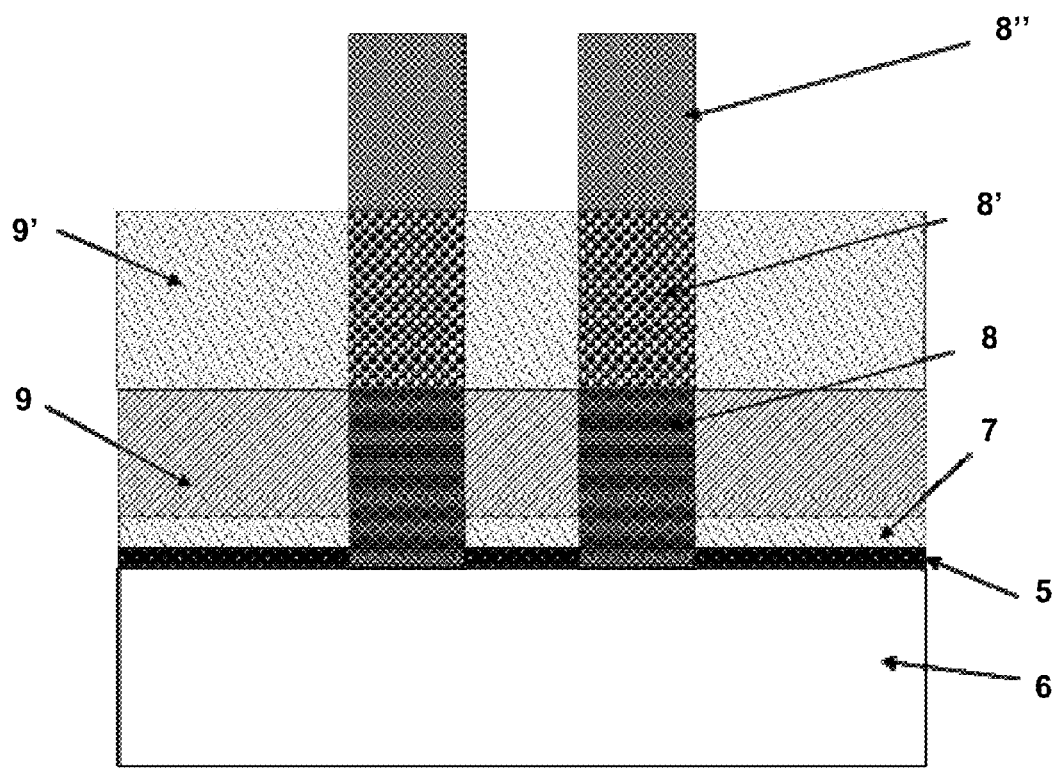
FIG. 15 is a schematic representation of a process step, as used to form a semiconductor device, according to example embodiments.

We now refer to FIG. 15 which shows the end result of step h in an embodiment of the first aspect. In this figure, a third part (8") of the III-V semiconductor nanostructure is epitaxially grown on the second part (8') of the III-V semiconductor nanostructure, the third part (8") having a top surface.

In embodiments, the third part (8") of the III-V semiconductor nanostructure may be doped. This is especially useful when the semiconductor device is a vertical field effect transistor since in that case the third part can serve as a drain or a source.

In embodiments, the third part (8") of the III-V semiconductor nanostructure may be made of the same material as the first part (8) of the III-V semiconductor nanostructure. In embodiments, the height of the third part (8") of the III-V semiconductor nanostructure may be from 30 to 200 nm (e.g., from 40 to 100 nm or from 60 to 80 nm).

Figure 16:
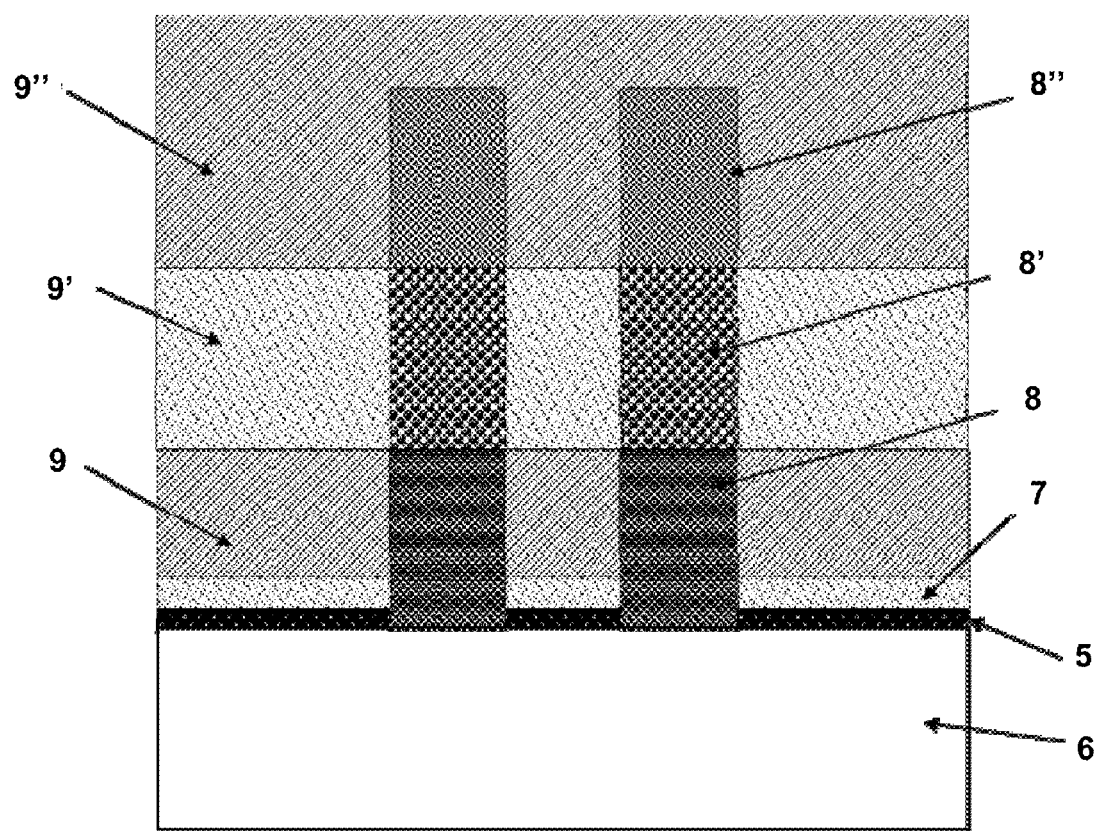
FIG. 16 is a schematic representation of a process step, as used to form a semiconductor device, according to example embodiments.

We now refer to FIG. 16 which shows the end result of step i in an embodiment of the first aspect. In this figure, the second part (8"') of the III-V semiconductor nanostructure may be covered with a layer (9") of a third material, different from the second material. In embodiments, the third material may be a dielectric material. The use of a dielectric material can be advantageous for instance when the semiconductor device is a field effect transistor and when the third part of the nanostructure is destined to be used as a source or a drain for the transistor. In that case, it can be advantageous to isolate the source or the drain from its surrounding by covering its sidewalls with a dielectric material. When the second material is a sacrificial material, the third material can be selected in such a way that the second material can be etched selectively with respect to the third material with the same etching chemistry making possible the selective etching of the second material with respect to the first material. For instance, the third material can be silicon nitride if the second material is silicon oxide or the third material can be silicon oxide if the second material is amorphous silicon a-Si.

In embodiments, the third material may be silicon nitride. In embodiments, the silicon nitride may be deposited by performing a Plasma Enhanced Chemical Vapor Deposition (PE-CVD) process or a Low Pressure Chemical Vapor Deposition (LP-CVD) process.

In embodiments, the first material and the third material may be the same.

Figure 17:
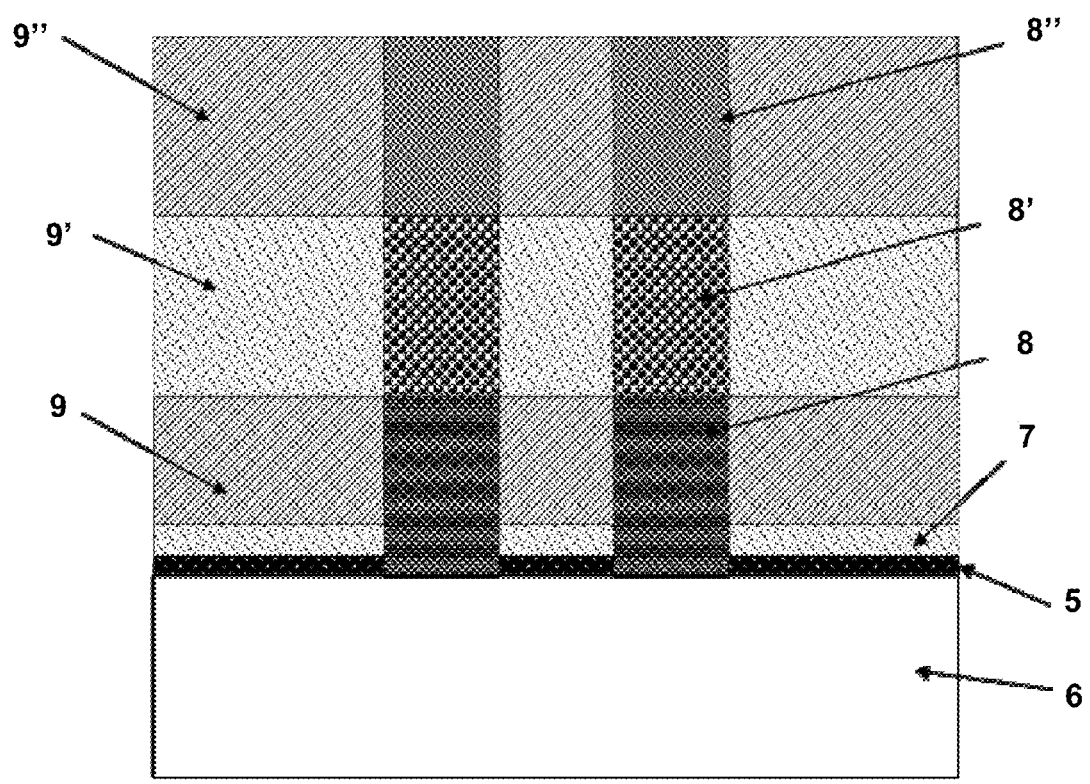
FIG. 17 is a schematic representation of a process step, as used to form a semiconductor device, according to example embodiments.

We now refer to FIG. 17 which shows the end result of step j in an embodiment of the first aspect. In this figure, a top portion of the layer (9") of the third material has been removed in such a way that its top surface is co-planar with the top surface of the third part (8") of the III-V semiconductor nanostructure, thereby exposing the top surface of the third part (8") of the III-V semiconductor nanostructure.

In embodiments, steps e through j may be iterated one or more times while, for each iteration, each ordinal number of the parts (8, 8', 8") of the III-V semiconductor nanostructure and of the materials of the layers (9, 9', 9") is increased by two units. This can permit the formation of a multi-gate device such as for instance a multi-gate vertical field effect transistor.

In any embodiment of the first aspect, the semiconductor device may be an intermediate in the fabrication of a vertical field effect transistor, wherein the first part (8) of the III-V semiconductor nanostructure comprises a source or a drain region, wherein the second part (8') of the III-V semiconductor nanostructure is a channel region, and wherein the layer (9') the second material is a sacrificial layer.

In any embodiment of the first aspect, the semiconductor device may be a vertical field effect transistor, wherein the first part (8) of the III-V semiconductor nanostructure comprises a source or a drain region, wherein the second part (8') of the III-V semiconductor nanostructure is a channel region, and wherein the layer (9') the second material is a gate electrode.

In embodiments of the first aspect, where the semiconductor device is a vertical field effect transistor or an intermediate in its fabrication, and where steps h to j are performed, the first part (8) and the third part (8") may be either a source and a drain or a drain and a source.

In embodiments of the first aspect where steps e through j are iterated one or more times, and where the semiconductor device is a vertical field effect transistor, the semiconductor device may be a multi-gate vertical field effect transistor, comprising a number of additional channels and of additional gate electrodes corresponding to the number of iterations.

In embodiments of the first aspect where steps e through j are iterated one or more times, and where the semiconductor device is an intermediate in the construction of a vertical field effect transistor, the semiconductor device may be an intermediate in the construction of a multi-gate vertical field effect transistor, comprising a number of additional channels and of additional sacrificial layers corresponding to the number of iterations.

In any embodiment of the first aspect, the nanostructure may be a nanowire.

In embodiments, when the second material is a sacrificial material that can be removed selectively with respect to the first material and when a step j has been performed, replacing the sacrificial material by a gate stack (a conductive material, an optional work function alignment film, and a dielectric film separating the nanostructure from the conductive material) may comprise the following steps: removing the sacrificial layer, covering the sidewalls of the second part of the III-V semiconductor nanostructure with a dielectric film, optionally covering the dielectric film with a work function alignment film, and filing the remaining space between the first material and the second material with a conductive material such as metal.

In embodiments, when the second material is a sacrificial material that can be removed selectively with respect to the first material and when a step j has been performed, replacing the sacrificial material by a gate stack (a conductive material, an optional work function alignment film, and a dielectric film separating the nanostructure from the conductive material) may comprise the following steps: covering the top surface of the third material and the top surface of the third part (8'") of the III-V semiconductor nanostructure with a further dielectric material (e.g. silicon nitride) in order to protect the top surface of the third part (8'"); dry etching part of the further dielectric material and of the third material (typically also a dielectric such as silicon nitride) in order to expose part of the sacrificial layer (e.g. made of silicon dioxide); removing the sacrificial layer by a wet etch process capable to selectively remove the sacrificial layer with respect to the first material (a HF solution can be used if the sacrificial layer is silicon dioxide and the first and third materials are silicon nitride), third material and III-V semiconductor nanostructure material; coating conformally the now exposed second part (8') of the semiconductor nanostructure with a dielectric film (this step typically also includes the deposition of the dielectric on the top surface of the layer (9) of first material and on the bottom surface of the layer (9'") of third material by depositing e.g. hafnium oxide by ALD); optionally covering the dielectric film with a work function alignment film; covering the dielectric film or the work function alignment film if present with a layer of conductive material (this layer fills the void left by the removal of the sacrificial layer, which has not yet been filled with the dielectric film and the optional work function alignment film); removing a top portion of the layer of conductive material (e.g. by CMP) in order to expose the top surface of the further dielectric layer protecting the nanostructure; etching back the layer of conductive material to a level situated below the top surface of the further dielectric layer; covering the exposed conductive layer with a dielectric; forming the drain (or source) contact on top of and in electrical contact with the top part (e.g. the third part or $(3+n)^{th}$ part) of the nanostructure, forming the gate contacts on top of and in electrical contact with the layer of conductive material; forming the source (or drain) contact in physical and electrical contact with the first part of the nanostructure. In embodiments, contacts between the source and the gate and between the drain and the gate may be insulated.

In a second aspect, the present invention relates to a semiconductor device obtainable by any embodiment of the first aspect.

The semiconductor device may for instance comprise:

A semiconductor surface (6'), a first part (8) of a III-V semiconductor nanostructure, abutting perpendicularly the semiconductor surface (6'), the first part (8) having a top surface and at least one side surface, a layer (9) of a first material covering the at least one side surface, the layer having a top surface co-planar with the top-surface of the first part (8) of the III-V semiconductor nanostructure, a second part (8') of the III-V semiconductor nanostructure, abutting perpendicularly the first part (8), the second part (8') having a top surface and at least one side surface, the second part (8') being made of a different material and/or being doped differently than the first part (8) of the III-V semiconductor nanostructure, and a layer (9') of a second material, different from the first material, covering the at least one side surface of the second part (8'), having a top surface co-planar with the top surface of the second part (8') of the III-V semiconductor nanostructure.

The semiconductor device, the semiconductor surface (6'), the nanostructure, its first and second parts (8, 8'), and the layers (9 and 9') may, in this second aspect, be according to any embodiment of the first aspect. The semiconductor device may also comprises a third part (8") of the III-V semiconductor nanostructure and a layer (9") of third material, in this second aspect, according to any embodiment of the first aspect.

For instance, the semiconductor device may be an intermediate in the fabrication of a vertical field effect transistor, wherein the first part (8) of the III-V semiconductor nanostructure is doped, thereby forming a source or a drain region, wherein the second part (8') of the III-V semiconductor nanostructure is not doped, thereby forming a channel region, wherein the third part (8") of the III-V semiconductor nanostructure is doped, thereby forming a drain or a source region, wherein the first and the third materials are dielectric materials and wherein the second material is a sacrificial material which can be etched selectively with respect to the first material and the nanostructure.

As another example, the semiconductor device may be an intermediate in the fabrication of a multi-gate vertical field effect transistor, comprising a number of additional channels and of additional sacrificial layers corresponding to the number of iterations.

In embodiments, the semiconductor device may also relate to the vertical field effect transistor (e.g. single gate or multi-gate) itself wherein the sacrificial material has been replaced by a gate.

In a third aspect, the present invention relates to a device comprising a field-effect transistor according to the second aspect. In embodiments, the device may comprise a plurality of field-effect transistors according to the second aspect. Examples of such electronic devices are bio-sensors, chemosensors, volatile memory, non-volatile memory, CMOS inverter, multiplexers, and logic circuits.

It is to be understood that although certain embodiments, specific constructions and configurations, as well as materials, have been discussed herein for devices according to some embodiments, various changes or modifications in form and detail may be made without departing from the scope of this invention. For example, any formulas given above are merely representative of procedures that may be used. Functionality may be added or deleted from the block diagrams and operations may be interchanged among functional blocks. Steps may be added or deleted to methods described within the scope of the present invention.

What is claimed is:

1. A method for forming a semiconductor device, comprising:
   providing a semiconductor surface;
   epitaxially growing on, and perpendicular to, the semiconductor surface a first part of a III-V semiconductor nanostructure, wherein the first part comprises a top surface;
   covering the first part of the III-V semiconductor nanostructure with a layer of a first material;
   removing a first top portion of the layer of the first material such that a top surface of the layer of the first material is co-planar with the top surface of the first part of the III-V semiconductor nanostructure, thereby exposing the top surface of the first part of the III-V semiconductor nanostructure;
   removing a third top portion, having a first thickness, of the first part of the III-V semiconductor nanostructure, such that the top surface of the first part of the III-V semiconductor nanostructure lies lower than the top surface of the layer of the first material;
   epitaxially growing on the first part of the III-V semiconductor nanostructure a second part of the III-V semiconductor nanostructure, wherein the second part comprises a top surface;
   subsequent to epitaxially growing the second part of the III-V semiconductor nanostructure, removing a fourth top portion, having the first thickness, of the layer of the first material;
   subsequent to removing the fourth top portion of the layer of the first material, covering the second part of the III-V semiconductor nanostructure with a layer of a second material, wherein the second material is different from the first material; and
   removing a second top portion of the layer of the second material such that a top surface of the layer of the second material is co-planar with the top surface of the second part of the III-V semiconductor nanostructure, thereby exposing the top surface of the second part of the III-V semiconductor nanostructure.

2. The method according to claim 1, wherein the semiconductor surface comprises a semiconductor substrate covered with a template layer, wherein the template layer comprises a through-hole exposing the semiconductor substrate, and wherein the through-hole has a horizontal cross-section corresponding to a horizontal cross-section of the III-V semiconductor nanostructure.

3. The method according to claim 1, wherein the semiconductor surface has Miller indices (1,1,1).

4. The method according to claim 1, wherein the first thickness is between 1 nm and 10 nm.

5. The method according to claim 1, wherein the first material comprises a dielectric material.

6. The method according to claim 1, wherein the second material comprises a sacrificial material that is selectively removable with respect to the first material and with respect to the second part of the III-V semiconductor nanostructure.

7. The method according to claim 1, wherein the second part of the III-V semiconductor nanostructure comprises a different material or is doped differently than the first part of the III-V semiconductor nanostructure.

8. The method according to claim 1, further comprising:
   epitaxially growing on the second part of the III-V semiconductor nanostructure a third part of the III-V semiconductor nanostructure, wherein the third part comprises a top surface;
   covering the third part of the III-V semiconductor nanostructure with a layer of a third material, wherein the third material is different from the second material; and
   removing a fifth top portion of the layer of the third material such that a top surface of the layer of the third material is co-planar with the top surface of the third part of the III-V semiconductor nanostructure, thereby exposing the top surface of the third part of the III-V semiconductor nanostructure.

9. The method according to claim 8, wherein the third part of the III-V semiconductor nanostructure comprises a different material or is doped differently than the second part of the III-V semiconductor nanostructure.

10. The method according to claim 1, further comprising:
    removing a fifth top portion, having a second thickness, of the second part of the III-V semiconductor nanostructure; and
    removing a sixth top portion, having the second thickness, of the layer of the second material.

11. The method according to claim 10, wherein the second thickness is between 1 nm and 10 nm.

12. The method according to claim 9, further comprising:
epitaxially growing on the third part of the III-V semiconductor nanostructure a fourth part of the III-V semiconductor nanostructure, wherein the fourth part comprises a top surface;
covering the fourth part of the III-V semiconductor nanostructure with a layer of a fourth material, wherein the fourth material is different from the third material; and
removing a sixth top portion of the layer of the fourth material such that a top surface of the layer of the fourth material is co-planar with the top surface of the fourth part of the III-V semiconductor nanostructure, thereby exposing the top surface of the fourth part of the III-V semiconductor nanostructure, wherein the fourth part of the III-V semiconductor nanostructure comprises a different material or is doped differently than the third part of the III-V semiconductor nanostructure.

13. The method according to claim 9, wherein the semiconductor device is an intermediate in a fabrication of a vertical field effect transistor, wherein the first part of the III-V semiconductor nanostructure is doped, thereby forming a first source region or a first drain region, wherein the second part of the III-V semiconductor nanostructure is not doped, thereby forming a channel region, wherein the third part of the III-V semiconductor nanostructure is doped, thereby forming a second drain region or a second source region, wherein the first material and the third material are dielectric materials, and wherein the second material comprises a sacrificial material which is selectively etchable with respect to the first material, the third material, and the second part of the III-V semiconductor nanostructure.

14. The method according to claim 1, wherein the III-V semiconductor nanostructure comprises a nanowire.

* * * * *